(12) United States Patent
Karni et al.

(10) Patent No.: US 8,494,016 B2
(45) Date of Patent: Jul. 23, 2013

(54) MODE LOCKED LASER SYSTEM

(75) Inventors: Yoram Karni, Qiryat Tivon (IL); Guy Cohen, Moshav Yaad (IL)

(73) Assignee: Legato Laser Technology Ltd., Qiryat Tivon (IL)

( * ) Notice: Subject to any disclaimer, the term of this patent is extended or adjusted under 35 U.S.C. 154(b) by 252 days.

(21) Appl. No.: 13/000,015

(22) PCT Filed: Jul. 29, 2009

(86) PCT No.: PCT/IL2009/000740
§ 371 (c)(1),
(2), (4) Date: Dec. 19, 2010

(87) PCT Pub. No.: WO2010/013241
PCT Pub. Date: Feb. 4, 2010

(65) Prior Publication Data
US 2011/0134942 A1    Jun. 9, 2011

Related U.S. Application Data

(60) Provisional application No. 61/084,295, filed on Jul. 29, 2008.

(51) Int. Cl.
*H01S 3/098*    (2006.01)
*H01S 3/13*     (2006.01)

(52) U.S. Cl.
USPC ............... 372/18; 372/29.02; 372/30

(58) Field of Classification Search
USPC ............ 372/18, 29.02, 29.03, 30, 32, 50.123, 372/29.023; 327/18, 29.02, 29.023, 30, 32, 327/50.123
See application file for complete search history.

(56) References Cited

U.S. PATENT DOCUMENTS

| | | | |
|---|---|---|---|
| 5,568,311 A | 10/1996 | Matsumoto | |
| 5,590,143 A | 12/1996 | Takara et al. | |
| 6,418,152 B1 * | 7/2002 | Davis | 372/18 |
| 7,649,915 B2 | 1/2010 | Fermann | |
| 7,688,499 B2 | 3/2010 | Fermann | |
| 7,804,863 B2 | 9/2010 | Adel | |
| 2006/0239312 A1 * | 10/2006 | Kewitsch et al. | 372/29.023 |

OTHER PUBLICATIONS

V. Daneu et al.,"Spectral beam combining of a broad-stripe diode laser array in an external cavity", Optics Letters, Mar. 15, 2000, vol. 25, No. 6, pp. 405-407.

* cited by examiner

*Primary Examiner* — Armando Rodriguez
(74) *Attorney, Agent, or Firm* — Mark M. Friedman

(57) ABSTRACT

A laser resonator cavity is presented. The laser resonator cavity comprises an optical manipulator of different longitudinal modes propagating along different optical paths. The optical manipulator is configured for adjusting a difference in optical lengths of the different optical paths thereby adjusting a frequency spacing between the different longitudinal.

17 Claims, 8 Drawing Sheets

Fig. 1 (General Art)

MODE LOCKED LASER SYSTEM

FIELD OF THE INVENTION

This invention is generally in the field of lasers and relates to a mode locked laser system.

BACKGROUND OF THE INVENTION

High peak power laser systems are very useful in a variety of applications requiring high harmonic generation of visible laser beams, optical parametric generation of near and mid IR laser beams etc. Such applications include, inter alia, material processing, optical memories, optical communication systems and medical systems. Most of these applications require short pulse laser beams having high intensity (peak power) at each pulse.

Attempts to use laser systems based on semiconductor gain medium, such as mode-locked diode lasers, for generation of short laser pulses were limited to relatively low peak power. Therefore, traditionally, non semiconductor laser systems such as broad area lasers (e.g. Ti:Sapphire and Nd:YAG) or doped fiber mode locked lasers are used to produce high intensity laser pulses.

In order to achieve pulsed laser beams having high peak power it is known to utilize mode locked laser systems operating with a multitude (e.g. thousands) of longitudinal laser modes. To this end, mode locking generally refers to the coherent addition of laser modes whose frequencies are spaced by a constant value, creating what is known in the art as "frequency comb", and where said addition is performed coherently, i.e. in a way that the relative phase between the different modes is kept fixed (i.e. locked).

Known in the art methods of the kind specified utilize spatial overlapping of multiple longitudinal modes propagating along the cavity. Referring to FIG. 1, there is illustrated schematically a typical mode locked laser system 100. System 100 includes a single-resonator optical cavity 110 of an optical length $L_{opt}$ (being the sum of the lengths times the refraction indices of all the elements along the cavity). The optical cavity 110 is defined by a space between a rear mirror 122 and an output coupler 124 (e.g. mirror). The optical cavity has an optical axis 112 of light propagation, a gain medium (or laser gain source) 130 and a mode locker 126 being located along the optical axis 112.

GENERAL DESCRIPTION

There is a need in the art in a novel laser system for control and manipulation of a pulsed laser beam. In this connection, the following should be noted.

Generally, an optical resonator cavity of a certain optical length $L_{opt}$ can support many laser modes manifested by standing light waves. These modes are divided into longitudinal and transversal modes, the former being distinguished by the number of nodes along the cavity and the latter—by the number and arrangement of nodes across the cavity. Hereinafter, longitudinal modes will be regarded as laser cavity modes having the same lateral profile but a different number of nodes along the cavity. In general, longitudinal modes have frequencies that differ by multiplicities of $\delta=c/2L_{opt}$, where c is the speed of light. Theoretically, the number of longitudinal (frequency) modes in a mode locked laser system may vary from two modes and up to many millions of modes having frequencies $f_k=f_0+k\delta$.

Mode locking involves coherent addition (i.e. by alignment of phases) of the longitudinal modes oscillating within the resonating cavity of the laser along the light propagation axis. This results in a periodic train of short pulses in the laser output. The pulse frequency $1/\tau$ (i.e. the repetition rate $1/\tau$ of pulses at laser output, $\tau$ being the period between pulses) equals to $\delta$. Therefore, for laser with a given average power $P_{ave}$, the pulse energy is:

$$P_{ave}/\delta = 2P_{ave}L_{opt}/c.$$

This relation directly relates the pulse energy to the optical length of the cavity and implicitly to the physical size of the laser.

Conventionally, coherent addition of waves of different longitudinal modes is achieved via the mode locking device (126 in FIG. 1) located within the laser cavity. Mode locking (i.e. the synchronization of phases of the different longitudinal modes) can be achieved by various mode-locking techniques such as passive, active, or non-linear Kerr effect based mode locking.

Active mode-locking utilizes frequency modulation or amplitude modulation of a laser beam (combined from the different longitudinal modes) through externally controlled modulators. Passive mode-locking is typically achieved through an absorber, which may comprise a saturable absorber material (e.g. fabricated from semiconductor material). Said saturable absorber is located within the cavity to thereby interact with a combined laser beam (combined from the different longitudinal modes) and to effect the radiation circulating within the cavity by absorbing lower intensity parts of said circulating radiation while transmitting parts of said radiation having relatively high intensity (the threshold for absorbance intensity being determined by the saturation fluence of saturable absorber). Thus, after several circulations of the radiation (round-trips) within the cavity, lower intensity parts of said radiation are suppressed while higher intensity parts are transmitted by said absorber and further amplified by the laser gain medium, thus eventually a single short pulse is formed circulating within the cavity. In the frequency domain the formation of a single circulating pulse corresponds to the creation of a fixed phase relationship between the longitudinal modes of the cavity. The circulating pulse in the laser cavity generates one output pulse each time it hits the output coupler. Thus, a regular pulse train is produced.

Applications using semiconductor lasers for generation of short laser pulses are typically limited to relatively low peak power. However, a variety of methods demonstrate higher brightness from semiconductor based laser systems.

A typical approach to achieving high brightness is by combining several laser sources while using external active feedback controls for adjusting the phases of the different light sources. An example for this approach is disclosed in US 2006/239,312 utilizes semiconductor lasers driven by opto-electronic feedback that control the laser's optical phase and frequency. Systems and methods to coherently combine a multiplicity of lasers driven to provide high power coherent outputs with tailored spectral and wavefront characteristics are disclosed in this patent publication. However, this method is cumbersome and expensive for industrial applications. Furthermore it cannot be efficiently utilized for creating pulsed high power mode locked lasers. It is mostly useful for the generation of high average power source.

Another approach consists of spectral combining of multiple lasers. An example of such a technique is disclosed in "*Spectral beam combining of a broad-stripe diode laser array in an external cavity*", V. Daneu et al., Optics Letters, Mar. 15, 2000, vol. 25, No. 6, pp. 405-407. According to this method, the outputs from several elements of a linear diode broad-stripes laser array is beam combined into a single beam. The beam combining is achieved by the use of a common external cavity containing a grating. The grating forces each array element to operate at a different, but controlled, wavelength and forces the beams from all the elements to overlap and propagate in the same direction.

The combined beam, however, is non coherent and thus the power in the combined beam is limited to the output from the bare laser array. Such laser sources are mainly useful when high brightness is required.

A straightforward improvement of this method is disclosed in U.S. Pat. No. 6,418,152 and adds to the spectral beam combining a mode locking by one of the techniques known in the art. Pulse repetition rate using this method is defined by the laser optical length as described above.

More conventional methods for achieving high peak power laser beam utilize a pumped solid state or fiber laser. In this case the laser operates in a single lateral mode and with many (e.g. thousands) of longitudinal laser modes creating the so called frequency comb. The design of the laser cavity is made to allow for equal trip time for the major part of the laser modes supported by the gain medium. In laser systems operating by this method the peak power is increased as a factor of the number of operating modes. However, these types of lasers are costly, and their output power is limited by non linear phenomena caused by the high peak power. The laser pulse frequency is equal to the speed of light divided by twice the cavity length and thus is normally limited to less then a giga hertz.

The present invention provides a novel laser system for control and manipulation of a pulsed laser beam. Generally, the system of the present invention utilizes mode-locking techniques in addition to individual manipulation of single modes or groups of modes that are involved in the creation of the mode locked laser light pulse. Mode manipulation results in a controlled frequency comb rather than that which is a mere result of the laser optical length, hence having a controlled pulse repetition rate and temporal shape and width.

The laser system of the present invention enables the adjustment and control of gain and loss on the one hand side, and adjustment and control of the optical path on the other hand side, for different active modes in the laser cavity individually. Such independent adjustment/control of the optical lengths and the gain/loss of different optical modes are achieved by utilizing a novel design of the laser resonator cavity that includes at least two optical regions. In the first region, the laser modes (i.e. light waves of different longitudinal modes) spatially overlap (e.g. thereby forming a pulsed laser beam), and in the second region the laser longitudinal modes are spatially dispersed by a spectral dispersive element. In this second region of the optical cavity, optical path lengths of different longitudinal modes as well as their gain and loss can be separately adjusted and/or controlled.

Furthermore, since the optical length of certain closed-loop optical paths of the cavity actually corresponds to certain allowable longitudinal modes (wavelengths/frequencies) within the cavity, by enabling to separately and independently adjust and/or control the optical lengths of different optical paths within the cavity, the system of the present invention actually provides for controlling frequencies of the allowable longitudinal modes of the cavity. Accordingly, this provides adjustment (and/or control) over some properties of the so called "frequency comb" of the longitudinal modes such as the frequency spacing ($\delta_k = f_k - f_{k-1}$) between different consequent longitudinal modes (k, k−1) of the frequency comb. These adjustments may provide control over the frequency of the output pulses of such laser system. It is to be understood that since the optical path is defined as the multiplication of the physical length by the refractive index manipulation of the optical path, the adjustment/control can be achieved either by changing the physical length or by changing the refractive index of the materials that compose the laser cavity, or by both.

For instance, in accordance with the present invention, frequency spacings 8 between the consequent longitudinal modes may be adjusted in accordance with a desired repetition rate (1/τ) of the laser pulses (which is equal to the frequency spacing δ), and substantially independently of the length $L_{opt}$ of the optical cavity. This enables to provide a pulsed laser system of low repetition rate, while having a relatively compact optical cavity, or, vice versa, a laser system of high repetition rate having a relatively larger size and substantial gain medium. Since the frequency spacing δ between the longitudinal modes is generally given by the derivative of the frequency to the longitudinal mode order:

$$\delta(f) = \left| \frac{df}{dk} \right| = \cdot \left| \frac{c}{2\left(L_{opt} + f \frac{dL_{opt}}{df}\right)} \right|,$$

the last equation implies that for a properly design of L(f), the spacing between the frequencies of adjacent modes, and therefore the pulse frequency, can be controlled over a very large range independently of the actual optical length and the physical size of the laser.

It is evident from the equation above that for small cavities a small variation of the optical length $L_{opt}$ of the cavity dramatically affects the frequency spacing between the allowable longitudinal modes and that increase in this length (e.g. by utilizing materials of higher refraction index or by changing the dimensions of the cavity) leads to much lower pulse frequencies and therefore much more energetic pulses.

The present invention, however, enables a decrease in the pulse repetition rate (1/τ) without significant change in the general optical length of the cavity and without posing substantial restrictions on the cavity's physical dimensions or on its structural complexity. In the conventional devices where different longitudinal modes propagate in an overlapping manner within the cavity, the general optical length would be the optical length of a cavity part up to a small deviation due to the cavity dispersion. In the resonator cavity of the invention, where different longitudinal modes propagate along different optical paths, the general optical length of a cavity is a reference optical length which is actually an average optical length taken over the lengths of the optical paths of the different longitudinal modes of the laser. As for the optical length of an optical path, it is generally a sum of the physical lengths of different materials along said optical path times respective refraction indices of the materials.

The above effect of a decrease in the pulse repetition rate is achieved by separately adjusting or controlling the length of the optical path of different longitudinal modes of the cavity to control the magnitude and sign of the derivative $dL_{opt}/df$. It should be noted that for negative derivatives the pulse repetition rates will increase, and for positive it will decrease.

Moreover, it should be understood that the invention also enables to maintain an equal frequency spacing δ(k,k−1) between the consequent longitudinal modes k, (k−1), thus enabling stable mode locking of the laser modes.

Additionally, since in accordance with the present invention in at least some regions of the cavity different light waves of different optical modes propagate along different paths, such laser system can be configured and operable to separately and independently increase or reduce the intensity of each of the longitudinal modes of the laser. This can be achieved by applying different filters in the part of the laser cavity in which the different modes are not spatially overlapping, or by manipulating the gain medium associated with each of the different optical paths. Filter examples includes but are not limited to spatial filters, dispersive elements, amplitude modulated filters, beam splitters, etc. The gain medium manipulation includes but is not limited to changes in physical dimensions, pumping intensity, and material compositions.

A laser system of the present invention typically comprises an optical light resonator cavity defined in between at least two, at least partially reflective surfaces (e.g. a rear mirror/input coupler and an output coupler). To this end, an optical resonator cavity is configured to define at least two closed paths of light propagation therein along which at least one longitudinal mode of light resonates between said reflecting surfaces. It should be understood that the allowable longitudinal modes resonating within the cavity are determined and should be supported by the optical lengths of the closed paths of light propagation defined within the cavity.

The optical cavity of the present invention further comprises a beam splitter/combiner assembly located therein along said light propagation paths. Said beam splitter combiner assembly, which can be embodied by a dispersive element, such as a grating, operates to define the light propagation paths of different longitudinal modes, such that at certain regions of the cavity said light propagation paths coincide, and thus a combined light beam of various longitudinal modes propagates therethrough, and other regions in which said paths are spaced apart such that a subgroup of the longitudinal modes containing at least a single longitudinal mode propagates along each of said spaced apart paths.

As noted above, in such configuration the optical length of each of said spatially separated optical paths can further be tuned by using a dispersion control assembly/unit (such as a phase retarding element) to adjust the exact frequency modes allowable for propagation along said path. Such tuning can be used to compensate the dependence of the refractive indices of the materials located within the cavity on the wavelength propagating therethrough. Alternatively as noted above, such tuning may be used to adjust or control the allowable longitudinal modes of the cavity and the spacing between them, independently of the general optical length of the cavity. Since each mode k resonates along its own path $S_k$, by introducing respective dispersion compensation units in paths $S_k$ of at least some of the modes (e.g. in regions where paths are spatially displaced from each other) the lengths of these paths can be adjusted to control the shape of the profile and/or the repetition rate ($1/\tau$) of the output laser pulses. Thus, decouple the pulse repetition rate ($1/\tau$) of the pulsed laser system from the general optical cavity length $L_{opt}$ (i.e. in such configuration $(1/\tau) \neq c/2L_{opt}$).

Furthermore, according to the invention, the optical length of the paths of different longitudinal modes of the cavity can be adjusted (i.e. pre-selected during a design stage of the laser's cavity) and/or controlled (tuned during the operation of the laser) to vary the spatial and temporal profile/shape of the laser pulses and their repetition rate $1/\tau$.

Additionally, the optical cavity of the present invention comprises a mode locker assembly located therein along the light propagation path of the combined light beam. As described above the mode locker assembly is designed to synchronize the phases of the different longitudinal modes light and to thereby enable and sustain the formation of a pulsed light beam formed by the combined continuous light waves of the various longitudinal modes propagating within the cavity.

As mentioned above, according to some embodiments of the present invention, the optical resonator cavity is configured to support resonation of light waves of various desirable longitudinal modes having different frequencies of $f_k$ respectively. Since the frequencies of the modes are determined (independently from each other) in accordance with the optical lengths of their respective optical paths, this can be achieved by adjusting the respective length of the optical paths of all of the desired modes, for example increasing or decreasing the optical length with the increase of the mode frequency. For example, this can be achieved by utilizing appropriate dispersion control units arranged in conjunction with the location and arrangement of the optical beam splitter/combiner assembly (diffractive element), or alternatively or additionally by utilizing an arrangement of multiple assemblies of spectral beam splitters/combiners (gratings) that are positioned within the optical cavity such that a desired optical length is obtained respectively for each longitudinal (spectral) mode.

It should be noted that a pulse laser having a tunable repetition rate may be obtained, for example, by utilizing tunable dispersion control units (such as some types of electro-optical crystals) and/or by allowing variations to the spatial arrangement of the multiple spectral beam splitters/combiners. Also, it should be noted that the present invention allows to maintain a substantially equal frequency difference (spacing) $\delta$ between the adjacent active longitudinal modes (e.g. $f=f_0+k\delta$) without restricting the frequency difference $\delta$ by the general optical length of the cavity.

The mode locker assembly utilized in the present invention can operate according to any of the known in the art mode-locking techniques including, inter alia, passive, active, or non-linear Kerr effect based mode locking techniques.

In applications in which very short pulses are needed, longitudinal modes of a wide spectral range are utilized for the creation of short pulses (as mentioned above, the pulse duration (pulse width) is determined by the reciprocal of the spectral width, i.e. $1/\Delta f$. In these cases, the optical length $L_{opt}$ of the cavity differs significantly for different modes of distinct frequencies due to the effect of dispersion of the refraction indices along the optical path of the cavity, the so-called group-velocity-dispersion (GVD). This results with the broadening of the pulse in the time domain. Thus, known in the art laser systems, designed for producing short pulses of light, typically utilize GVD management units (element 128 in FIG. 1), such as prism units, located in the optical path of the beam within the optical resonator cavity.

However, in these applications requiring laser system operation with short pulses, generally all of the longitudinal modes, which propagate within the cavity, overlap in space and therefore, typically, a single GVD management unit handles the velocity dispersion of all modes simultaneously and thus a limited spectral width can be supported by the optical cavity limiting the generation of ultra short pulses.

In the laser system of the present invention, ultra short pulses can be generated by utilizing dispersion control assembly comprising a multitude of separated dispersion control units, each associated with different longitudinal mode(s) and located along the spaced apart path(s) associated with said mode(s). In this arrangement, the velocity dispersion of different longitudinal modes is handled by a multitude of dispersion control units and the dispersion of each longitudinal mode is handled separately and therefore practically may support in principle unlimited spectral width. Each of said dispersion control units can be made with a predetermined or controllable optical properties (e.g. refraction index, width etc) and thus ultra short pulses can be generated.

As noted above, in some embodiments of the present invention said dispersion control assembly includes dispersion control units that enable a controllable tuning of their optical length, for example by fabricating said units from materials having refraction indices susceptible to applied electric field.

To implement the mechanism of mode locking, the frequency spacing between the active laser modes is to be constant. In the standard single gain medium configuration, this condition can be automatically achieved once the optical length of the cavity for the different modes is constant, i.e. the frequency spacing is $\delta=c/2L_{opt}$. By mode selection, that results straightforward by the spatial separation of the optical paths, the frequency spacing can be multiplied, if, by means of loss mechanism, only even or odd modes are allowed the frequency spacing and the repetition rate will be twice higher i.e. $2\delta$. Larger frequency spacing can be achieved straightforwardly.

Although pulses with very high repetition rate ($1/\tau$) can be generated by spacing the frequencies of the gain media (i.e. increasing $\delta$), this procedure generally requires utilizing shorter cavities. Therefore, standard mode locked lasers are usually limited to a few tens of GHz, higher frequency modes require too short cavities. In the present invention, the optical length of the modes is independently controlled, and the mode frequency spacing and thus the repetition rate can be more flexibly defined.

Comparing some aspects of the technique of the present invention to the respective ones of the existing configurations of mode locked lasers, the invented system can be manufactured from semiconductor gain media, such as gallium arsenide, and therefore be much more compact and cheaper than existing lasers. Also, the gain media used in the laser system of the invention amplify continuous wave light, and therefore do not suffer from saturation and are much less sensitive to damage. Therefore a higher average power can be achieved.

Thus, according to one broad aspect of the invention, there is provided a novel laser resonator cavity. The laser resonator cavity is characterized by a general optical length and comprising an optical manipulator of different longitudinal modes propagating along different optical paths. The optical manipulator is configured to manipulate (control and adjust) different longitudinal modes propagating along different optical paths, by adjusting a difference in optical lengths of the optical paths thereby adjusting a frequency spacing between the different longitudinal such that said frequency spacing is independent of said general optical length.

The resonator cavity may be configured for controlling the spatial and temporal shape of the output pulse and its repetition rate, enabling operation with short-pulse output. In this connection, the resonator cavity may include an intracavity intensity control assembly, this enabling control of both the amplitude and the frequency of the different longitudinal modes. The intensity control assembly may be accommodated along the optical path of the combined light beam. The intensity control assembly may include a multitude of intensity control units arranged across the different optical paths of the different longitudinal modes propagating within the cavity, where the intensity control units are configured to adjust the relative intensities of each of the different modes propagating in the different paths separately.

The spacing (frequency difference) between the different mode may be adjusted to be independent of the cavity's general optical length, e.g. by arranging, independently, the optical length of each of the different modes by introducing different dispersion control media in the mode's paths and/or by controlling the physical lengths of the paths utilizing one or more spectral beam splitters/combiners.

The laser cavity is configured to define at least first and second optical regions, wherein the first optical region is configured to create a spatial overlap between light waves of different longitudinal modes thereby forming a pulsed laser beam, and the second optical region is configured to create spatial dispersion of the laser longitudinal modes with a frequency spacing between consequent longitudinal modes being independent of a general optical length of the cavity, thereby enabling separate manipulation (control and adjustment) of different longitudinal modes (e.g. their optical path lengths, and/or gain, loss, intensity) within said second optical region.

According to another broad aspect of the invention, there is provided a laser resonator cavity characterized by a general optical length and configured for controlling one or more properties of a frequency comb of longitudinal modes of light waves propagating through the cavity, said one or more properties comprising a frequency spacing between the consequent longitudinal modes of the frequency comb, thereby enabling control the frequency of output pulses of the cavity and an output pulse shape, the frequency spacing being independent of said general optical length.

According to yet another broad aspect of the invention, there is provided a laser system configured and operable with short-pulse output. The laser system comprises an external optical resonator cavity which comprises: a spectral beam splitter/combiner assembly configured and operable to combine light components of different spatially separated longitudinal modes propagating along different optical paths from one or more gain media into a combined light beam and to separate a combined light beam into different longitudinal mode components to propagate along different spatially separated optical paths; and a mode locking assembly accommodated in the optical path of the combined light beam.

In some embodiments of the invention, the one or more gain media comprise an array of optical gain sources. The latter are arranged along an axis substantially perpendicular to an optical axis of the cavity and are accommodated in the different optical paths of the different longitudinal modes propagating within the cavity. The array of optical gain sources may comprise a semiconductor material.

Preferably, frequencies ($f_k=f_0+k\delta$) of the longitudinal modes amplified by one or more gain media are spaced by a constant value of $\delta$.

The optical cavity may comprise a light collection unit interposed between the one or more gain media and the spectral beam splitter/combiner assembly. In some embodiments, the light collection unit comprises a collimating optical system configured to direct the different spatially separated longitudinal mode light components from the gain media onto the spectral beam splitter/combiner.

In some embodiments, the mode locking assembly comprises a saturable absorber.

The optical cavity may comprise a dispersion control assembly adapted to adjust optical lengths of the optical paths associated with lightwaves of the different longitudinal modes propagating through the optical cavity. The dispersion control assembly may be configured to adjust the optical lengths of the optical paths such that the optical lengths are equal. The optical lengths may be adjusted in conjunction with the optical properties and spatial arrangement of the spectral beam splitter/combiner and the gain media such that the frequencies ($f_k=f_0+k\delta$) of the longitudinal modes amplified by the gain media are spaced by constant equal amount $\delta$.

The dispersion control assembly may comprise a multitude of dispersion control units arranged across the different optical paths of the different longitudinal modes propagating within the cavity, where the dispersion control units are configured to adjust the optical length of each of the different paths separately. The dispersion control units may be of controllable optical length. The dispersion control units may be made of material(s) having refraction index(ices) varying in response to application of an external electric field.

The dispersion control assembly may be accommodated within the cavity along the optical path of the combined light beam.

The gain media may comprise an array of semiconductor edge emitting laser sources; or a broad area semiconductor edge emitting laser source; or an array of semiconductor vertically emitting laser sources. The gain media may comprise spaced apart laser gain medium regions having different lasing properties.

BRIEF DESCRIPTION OF THE DRAWINGS

In order to understand the invention and to see how it may be carried out in practice, embodiments will now be described, by way of non-limiting example only, with reference to the accompanying drawings, in which:

FIG. 3B shows the frequencies of the two cavities as function of the longitudinal mode order.

DETAILED DESCRIPTION OF EXEMPLARY EMBODIMENTS

The invention disclosed herein presents a novel system for generation of a mode locked laser beam. It is an object of the present invention to provide system and method for generation of pulsed laser system in general and particularly high energy pulse laser systems. It is further an object of the present invention to provide a pulse laser system which possesses greater flexibility in controlling and enhancing various parameters of the laser pulses such as pulse intensity, repetition rate, pulse duration (width) etc.

Figure 1:
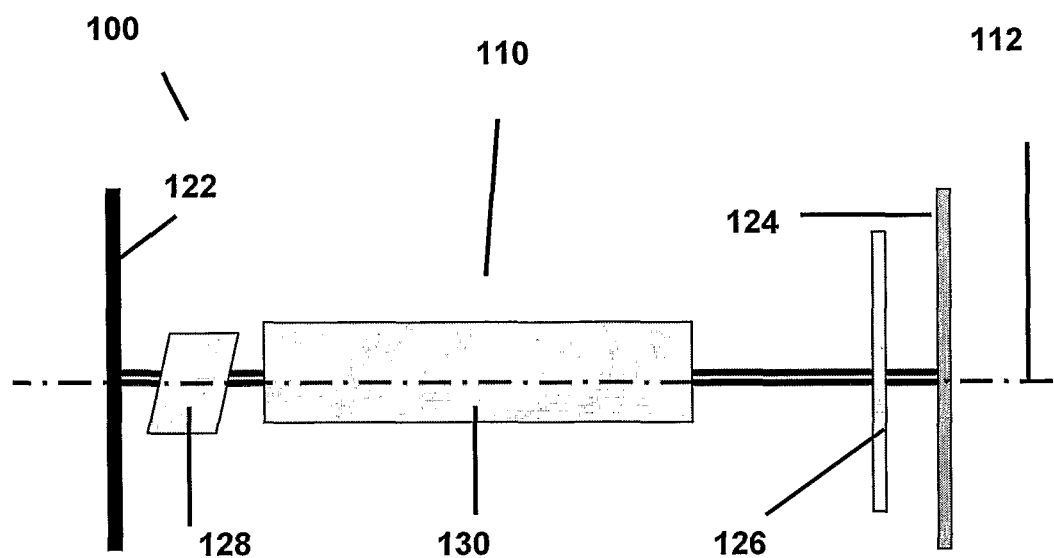
FIG. 1 is a schematic illustration of a laser system utilizing the known approach for mode locking.

FIG. 1 illustrates the known in the art approach for mode locked laser systems.

Figure 2:
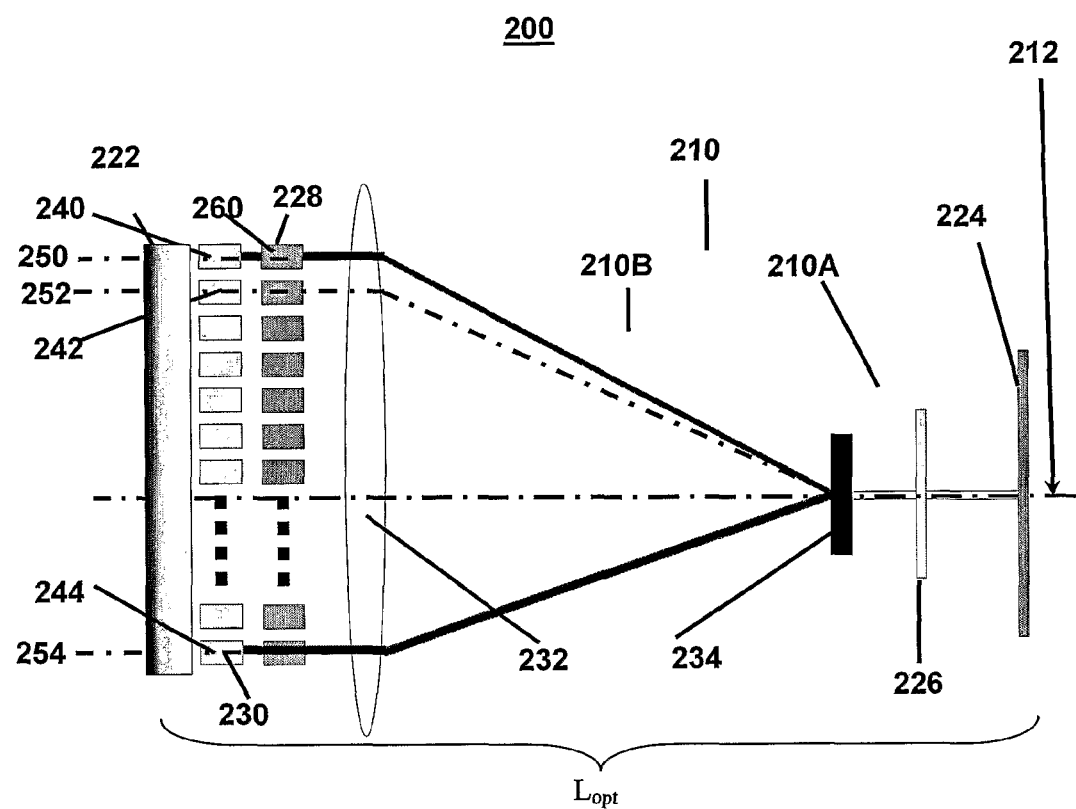
FIG. 2 is an example of a mode locked laser system according to the invention.

Reference is made to FIG. 2 showing an embodiment of a mode locked laser system 200 configured and operable according to the present invention. The laser system 200 comprises an external optical resonator cavity 210 defined in between light input and output couplers 222 (e.g. a rear mirror) and 224. The cavity 210 defines an optical axis 212 of light propagation through the cavity in between the input and output couplers and is characterized by a certain reference or general optical length $L_{opt}$ as defined above.

The resonator cavity 210 comprises a spectral beam splitter/combiner assembly 234 (or dispersive element, e.g. grating, prisms or superprism) and a mode locker 226 which are located within the cavity along the optical axis 212 such that the mode locker 226 is located in between the spectral beam splitter/combiner 234 and the output coupler 224. Further, resonator cavity 210 of the present invention includes an optical manipulator 228 for manipulating different longitudinal modes propagating along different optical paths within the cavity.

As further shown in the figure, the laser cavity includes an array 230 of gain media (generally at least one gain media), which are located in the cavity and arranged in a spaced-apart relationship transverse to the optical axis 212. The array 230 of gain media may be formed by a multitude of spaced apart laser gain medium regions (e.g. 240, 242 . . . 244), fabricated of similar or different materials and having optionally different lasing properties. Gain media regions are pumped to generate light components of different longitudinal modes (frequency ranges), respectively each gain medium serving at least one longitudinal mode. The gain media may include an array of semiconductor edge emitting laser sources, or a broad area semiconductor edge emitting laser source, or may include an array of semiconductor vertically emitting laser sources.

The system 200 is configured to collect all the light components of different longitudinal modes onto the spectral beam splitter/combiner 234. This can be achieved by using a common light collection unit (e.g. collimate lens unit or alternatively lens-set) 232 located in between the gain media array 230 and the spectral beam splitter/combiner 234, the focal point of the lens 232 being located on the spectral beam coupler 234. Thus, as exemplified in FIG. 2, light rays from the gain media impinging onto the lens 232 parallel to the optical axis 212 are collected/focused on to the grating 234 and different light beams, arriving from the spectral combiner at different angles, are directed to pass through different gain media 230.

Optical manipulator 228 is configured for adjusting a difference in optical lengths of the different optical paths to thereby provide adjustment of a frequency spacing between the different longitudinal modes such that the frequency spacing is independent of the general optical length. In the present example, the optical manipulator 228 includes a dispersion control assembly (or phase retarding assembly), which in the present example includes an array of dispersion control units operating together with the beam splitter/combiner 234 for adjusting the optical length of different longitudinal modes. As mentioned above, different longitudinal modes may be single modes or group of modes. Dispersion control units 228 is located in between the lens 232 and the input coupler (rear mirror) 222, and are arranged in a spaced-apart relationship transverse to optical axis 212. It should be noted, although not specifically shown that the dispersion control assembly may alternatively or additionally be located between the spectral splitter/combiner and the output coupler.

In this example, dispersion control units 228 are located within the cavity at respective distinct optical paths of light waves associated with different longitudinal modes. As indicated above, the refraction index of the dispersion control units can be designed or tuned to provide an equal frequency spacing δ between the modes, thus controlling the pulse repetition rate (e.g. enabling ultra-high pulse repetition rate).

In some other embodiments, the dispersion control assembly may be accommodated within the cavity along the optical path of the combined light beam.

Alternatively or additionally, the optical cavity may include an intensity control assembly. The latter may include a multitude of intensity control units arranged across the different optical paths of the different longitudinal modes propagating within the cavity. In such embodiment, the intensity control units are configured to adjust the relative intensities of each of the different modes propagating in the different paths separately.

Figure 3A:
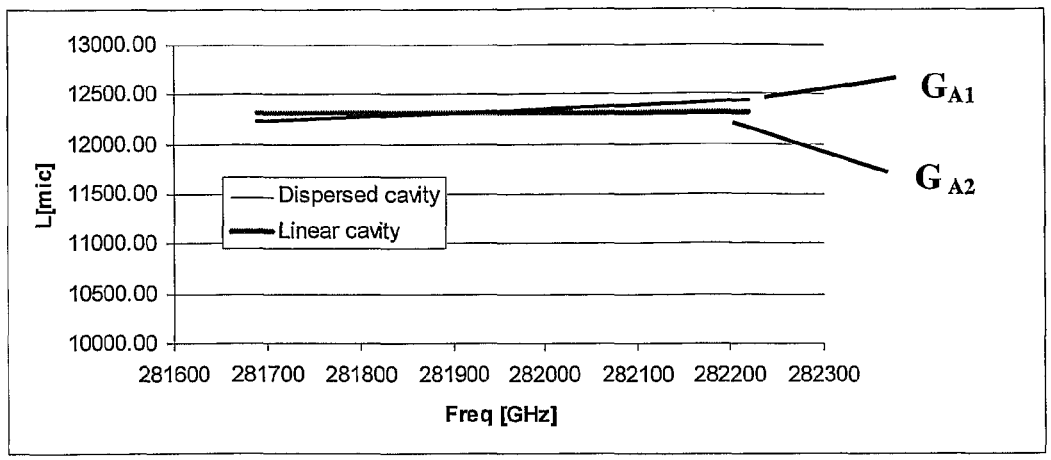
FIGS. 3A and 3B illustrate the variation of laser sensitivity of the frequency spacing to small changes in the optical length, where FIG. 3A compares two cavities of typically 12 mm long, in the first cavity the optical length is constant for all frequencies (linear cavity) while for the other case the optical path is dispersed and its length slightly increases with the frequency (dispersive cavity)

Reference is made to FIG. 3A that illustrates graphically the variation of the optical lengths of different longitudinal modes within two resonator cavities. Graph $G_{A2}$ illustrates an example of a linear resonator cavity in which the optical lengths of different longitudinal modes are equal. Graph $G_{A1}$, corresponding to a resonator cavity of this invention comprising a dispersive element (e.g. superprism), illustrates that the optical lengths of different longitudinal modes within such cavities slightly vary with respect to each other with an increase in the mode frequency. Generally, the optical lengths of the modes' paths can be adjusted such as to present a monotonic function of increase/decrease of the length with the increase of frequency. In this example, the optical length monotonically increases with the frequency.

Figure 3B:
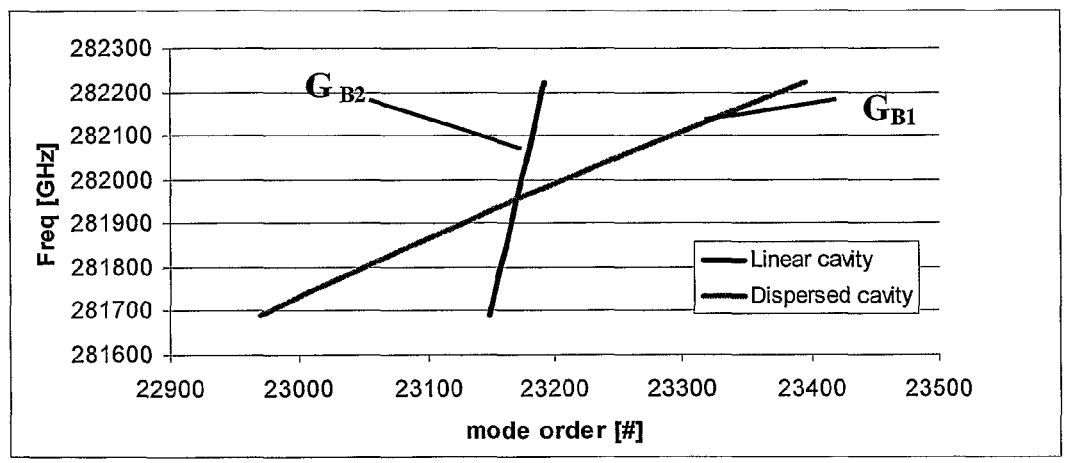

FIG. 3B illustrates graphs $G_{B1}$ and $G_{B2}$ which correspond to the variation of the longitudinal mode frequencies vs. the mode order for respectively the dispersed and linear cavities of FIG. 3A. The slopes of graphs $G_{B1}$ and $G_{B2}$ correspond to the frequency spacings in the cavities. It is evident that the small increase in the optical cavity length for the different longitudinal modes shown in graph $G_{A1}$ in FIG. 3A reduces the frequency vs. mode order slope by a factor of 10, thus reducing the frequency spacing by the same factor. The slope and therefore the mode spacing and pulse repetition rates are much smaller for the cavity with the increasing optical length.

Figure 3C:
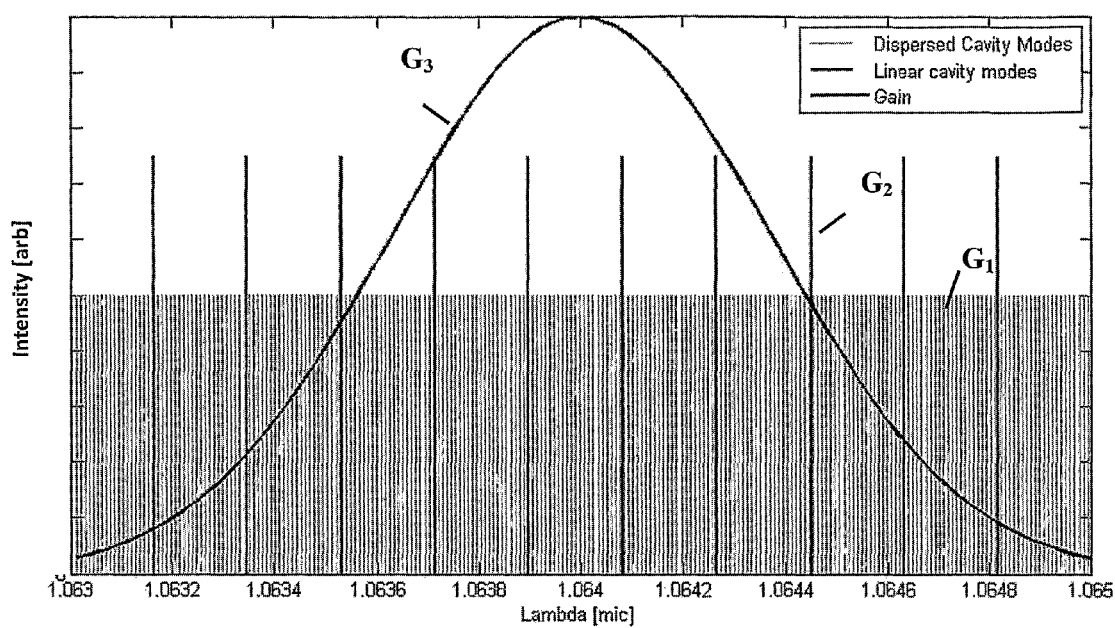
FIG. 3C illustrates graphically the wavelength spacing of the longitudinal modes corresponding to the cavity longitudinal modes of a laser system having a dispersed cavity constructed in accordance with the present invention and to the longitudinal modes of a laser system having a linear optical cavity.

FIG. 3C illustrates graphically the wavelengths of the longitudinal modes of these cavities, a gain spectrum of ~1 nm width is shown for the illustration. It is evident that the gain supports a much larger number of modes of the dispersed cavity. The number of longitudinal modes in the dispersed cavity laser system is 10 times greater than the number of longitudinal modes in the linear cavity laser. Hence, given a laser with the same average output power, the average modal power in the dispersed cavity system is about tenth of that in the linear cavity. However, the peak power, of the output pulses is about 10 times greater in the dispersed cavity system. Accordingly, the pulse repetition rate in the dispersed cavity laser system is 10 times smaller than that of the linear resonator cavity system.

Figure 4:
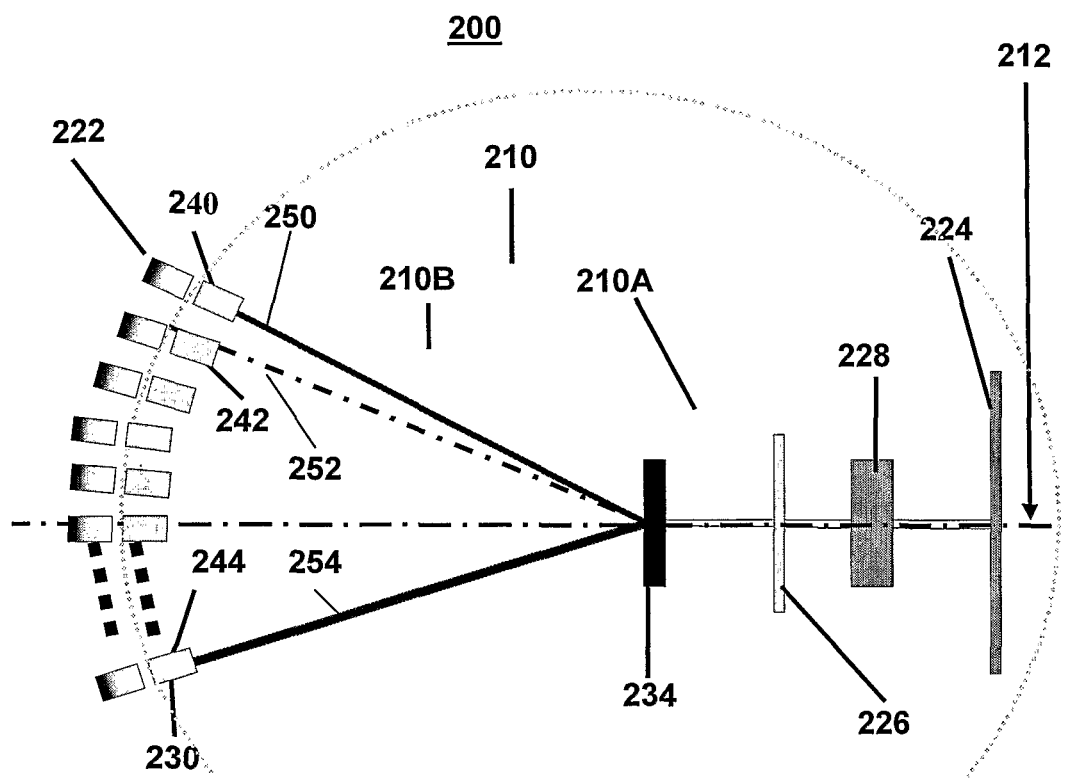
FIG. 4 shows another example of a mode locked laser system according to the invention.

Referring back to FIG. 2, it should be noted that the provision of lens 232 is optional, and the lens can be substituted by other optical elements, or can be omitted. In the latter case, the different gain media, rear mirror and dispersion control units are appropriately arranged and orientated to be in the optical path of the light components of different longitudinal modes that propagate in between the rear mirror and the spectral beam splitter/combiner. This is schematically illustrated in FIG. 4. To facilitate understanding, the same reference numbers are used to identify components common to the examples of the invention described herein.

In the embodiment shown in FIG. 4 the optical gain elements (constituting gain regions) 230 are arranged in a two-dimensional array being spaced along the optical axis and along an axis transverse thereto, being thus at a certain distance and angular orientation with respect to the beam splitter/combiner 234. The locations of said optical gain elements are determined to selectively define the longitudinal modes impinging on each of said gain elements and to thereby determine the active longitudinal modes amplified within the optical cavity 210 of the laser system. Accordingly, a respective array of rear mirrors 222 (constituting the input coupler) is provided. Each of said rear mirrors, associated with the respective optical gain element, is located on a light propagation path connecting the beam splitter/combiner 234 and said optical gain element and oriented perpendicularly to said light propagation path.

As indicated above, the array of gain media may comprise a multitude of spaced apart laser gain medium regions fabricated of similar or different materials and having optionally different lasing properties. The location and spacing of the different gain regions is appropriately determined in conjunction with the optical properties and the locations of the spectral beam splitter/combiner 234 and the lens 232, and the optical length of the optical cavity 210, to thereby enable distribution of different longitudinal modes of light, supported by the cavity, across different regions of the gain array 230. For the active (supported during propagation through the cavity) longitudinal modes, different light propagation paths (e.g. 250, 252 . . . 254) are defined within the cavity associated with different gain medium regions (e.g. 240, 242 . . . 244).

Thus, in a first region 210A of the cavity 210 located in between the spectral beam combiner 234 and the output coupler 224, light waves of different modes propagate along the optical axis 212, while spatially overlapping. Mode locker unit 226 and possibly another optical element (e.g. a dispersion control assembly) that operates on the combined laser beam (comprising all active modes) is located within this region 210A of the cavity.

The combined beam, which propagates along the axis 212 within the first region 210A and passes through the spectral beam splitter/combiner 234, is split, by the spectral beam splitter 234, to its different longitudinal modes constituents. Each of said constituent modes propagates within a second cavity region 210B (located in between the spectral beam splitter/combiner 234 and the rear mirror 222) along its own distinct light propagation path (e.g. 250, 252 . . . 254). This configuration enables to introduce, within said region 210B, various optical elements designed to operate on a single or a bundle of longitudinal modes of light separately. In the present example such optical elements include the array of gain media regions 230 and the array of dispersion management units 228. Each region of the gain media array and each dispersion control unit can be designed to operate on specific longitudinal mode(s) of light (a single mode or a multitude of modes); and each of said regions of gain media and each of the dispersion control units can be designed to have different optical properties configured to handle the specific mode(s) it is designed for.

Thus, each of the longitudinal modes propagates, within the cavity region 210B, along a distinct optical path and is in the form of a continuous wave (as opposed to an optional formation of a pulse that may occur in the region 210A in which a wave-group can be formed by the spatially overlapping longitudinal modes propagating therein).

The multiple gain media 230 are arranged transversally to the light propagation axis of the cavity such that the light propagation path of each longitudinal mode passes through a different gain region of the gain media. This configuration enables each gain region to amplify only a single longitudinal laser mode in the form of a continuous wave and therefore each of the gain regions experiences constant power; the gain regions are not affected by non-linear phenomena that may be caused by high intensity light pulses propagating therethrough.

The spacing between the gain medium and the alignment to the spectral beam combining is made such that the frequencies of the longitudinal modes that pass through the gain media will satisfy the condition $\omega_n = \omega_0 + n\delta$. The mode locker enables to couple back into the gain medium only light which is mode locked.

As indicated above, in some embodiments of the present invention, the laser system is configured with an array of gain media comprising different regions made by different gain materials. The lasing properties of said different regions can support emission of light of, possibly, different frequencies at different regions. In this case, such gain array supports lasing at a broad spectral width and enables very short pulse durations.

Furthermore, each of the regions of said gain media array can selectively and controllably be pumped to enable separate control of the amplification and intensity of each of the modes supported by said array of gain media 230 and by the cavity.

In some embodiments of the present invention, an array of dispersion control units (element 226 in FIG. 2) is located in between the rear mirror (input coupler) and the spectral beam splitter/combiner 234. Said array of dispersion control units can be configured to, separately, adjust the optical length of each the modes resonating within the resonator cavity. This can be achieved by locating said dispersion control units in the distinct optical paths of propagation of the desired mode (s). Each of said dispersion control units can be formed of different materials having suitable refractive indices adapted to adjust the optical length of the respective longitudinal modes associated with said units. Having the various longitudinal modes of the cavity propagating along distinct light propagation paths allows for adjusting and controlling separately the lengths of propagation paths to thereby determine, with improved accuracy, the allowable longitudinal modes along each of said optical paths and thus provide greater freedom in determining the longitudinal modes supported by the cavity.

As indicated above, optical resonator cavity of length $L_{opt}$ can support longitudinal laser modes manifested by standing light waves and having frequencies that are multiplicities of $\delta = c/2L_{opt}$. An optical cavity of the present invention defines at least two light propagation paths wherein optical length of each of said paths can be predetermined and/or controlled. In this case, such a cavity can sustain a multitude of light propagation paths (e.g. two) of different optical lengths (e.g. $L_{opt1}$ and $L_{opt2}$) to thereby support greater range of longitudinal modes (e.g. multiplicities of $\delta = c/2L_{opt1}$ and of $\delta = c/2L_{opt2}$).

In some embodiments of the present invention, the separate dispersion control units are made of materials having refraction indices that vary in response to application of an external electric field (voltage), thereby enabling controllable adjustment of the optical length of resonation of each of the longitudinal modes (or several adjacent modes) separately before they combine via the spectral beam combiner and pass through the mode locker and the output coupler mirror. This configuration allows for fine tuning of the group velocity dispersion and the spectral spacing ($\delta$) between the different longitudinal modes, thereby enabling fine tune adjustments of the resultant combined output beam.

In the present invention, similarly to standard mode locked laser systems, the pulse duration is of the order of the reciprocal of the spectral width $N\delta$, where N is the number of active longitudinal modes, the peak power is of the order of $N^2 P_{ave}$, $P_{ave}$ being the average power of a light beam of a single longitudinal mode.

The invention, in some embodiments thereof, provides for a high power pulsed laser system utilizing semiconductor array of gain media. The array of gain media may be fabricated on a semiconductor wafer with a pitch of 10 micrometer.

An example of a laser system of the present invention that utilizes a semiconductor gain medium array unit of a length of 1 cm (e.g. that includes about 1000 gain media regions) may achieve a total average beam power of several tens of watts and spectral width of the order of several terahertz. Said laser system, operated according to the present invention, i.e. by spectrally combining and mode-locking the different longitudinal modes of light emitted from the semiconductor gain media array, a pulsed output laser beam is produced having a peak power of the order of several tens of kilowatts. In this case, pulse duration of less than a picosecond can be achieved with pulse repetition rate of about GHz.

It should be noted that the properties of the output beam such as the beams intensity, the pulse duration and repetition rate are scalable and dependant, inter alia on the number of longitudinal modes. Thus, a pulse frequency of the order of terahertz can be achieved by broadening the frequency separation and the spectral width used.

Figure 5:
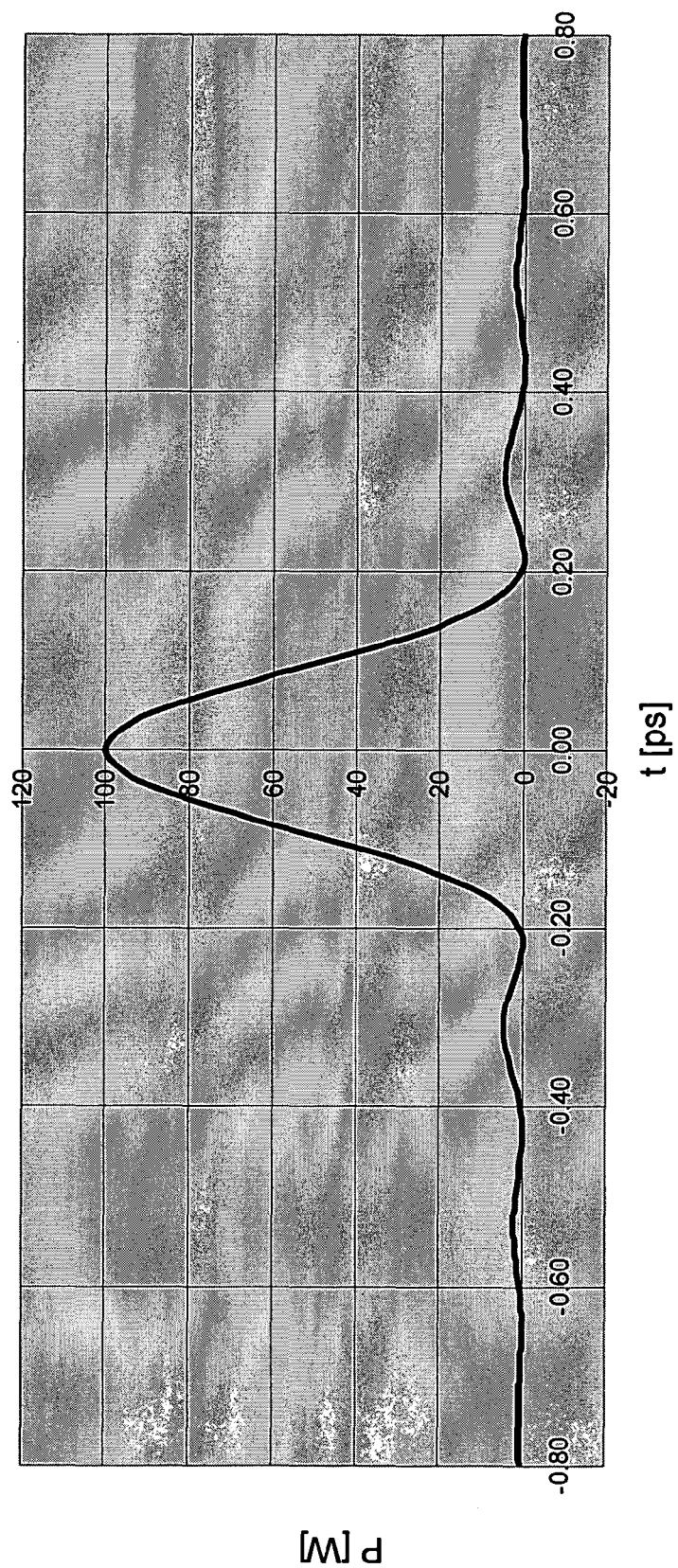
FIG. 5 exemplifies the time profile of the output of a laser system according to the invention.

Reference is now made to FIG. 5 illustrating a time profile of the output power of a laser system of the present invention. The laser system comprises an array of 100 laser gain media supporting a range of wavelengths of 5 nm centered around 1000 nm spaced by ~15 GHz and having total average power of 1 Watt. As shown in the figure, peak power of 100 W is achieved with a pulse duration of ~200 fs.

In some embodiments, the laser system of the present invention includes a linear array (e.g. as in a laser diode bar) or a broad area element of optical gain media fabricated by semiconductor material. In these embodiments, the gain sources can be made on a semiconductor wafer and located within the optical cavity as described above (see FIG. 2 element 230).

Figure 6:
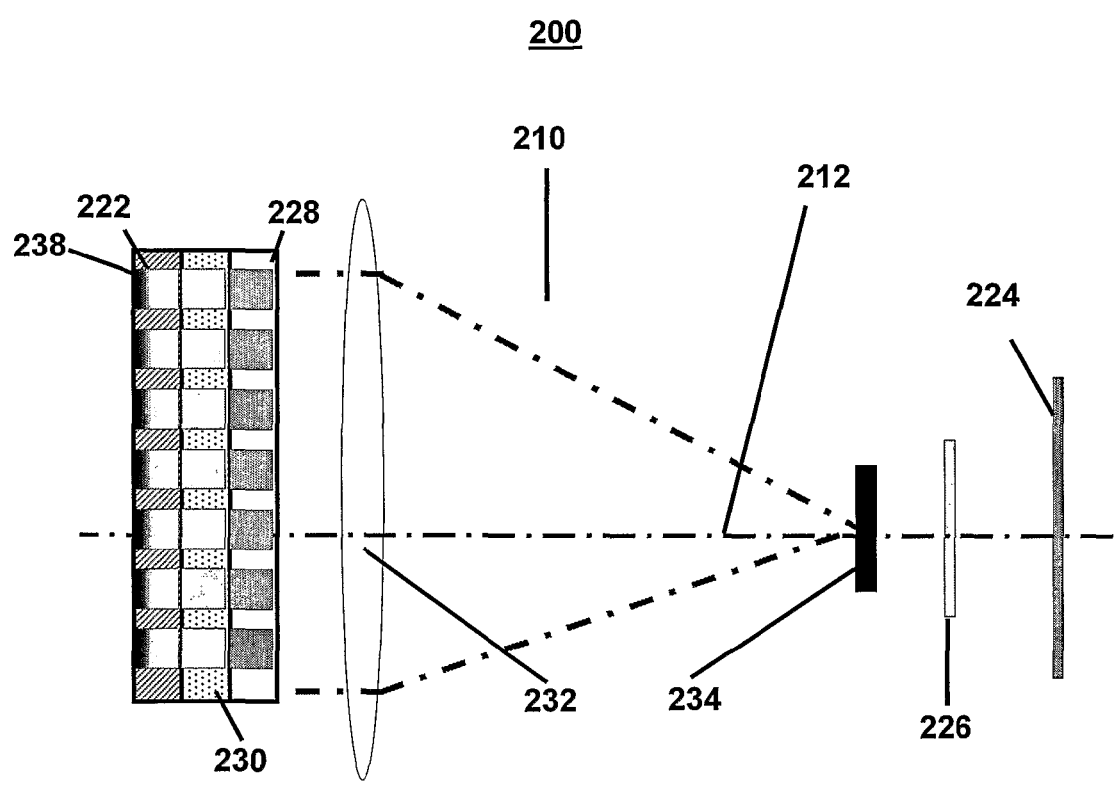
FIG. 6 shows schematically yet another example of the laser system of the invention utilizing an integrated structure.

Alternatively, an integrated structure of multiple layers can be fabricated by semiconductor materials. An example of a laser system comprising such integrated structure is shown schematically in FIG. 6. Here, the gain media array, the input couplers (rear mirrors) and the dispersion control units are all implemented as an integrated structure 238.

The gain media array 230 may be manufactured from semiconductor gain media, such as gallium arsenide, and may comprise surface emitting semiconductor laser sources or edge emitting semiconductor laser sources. Thus, the present invention provides a simple and effective solution for the mode locked laser system capable of producing high-power pulsed lasing. The principles of the invention can be easily used with semiconductor lasers, and can be used in laser systems manufactured by integrated technology.

Figure 7A:
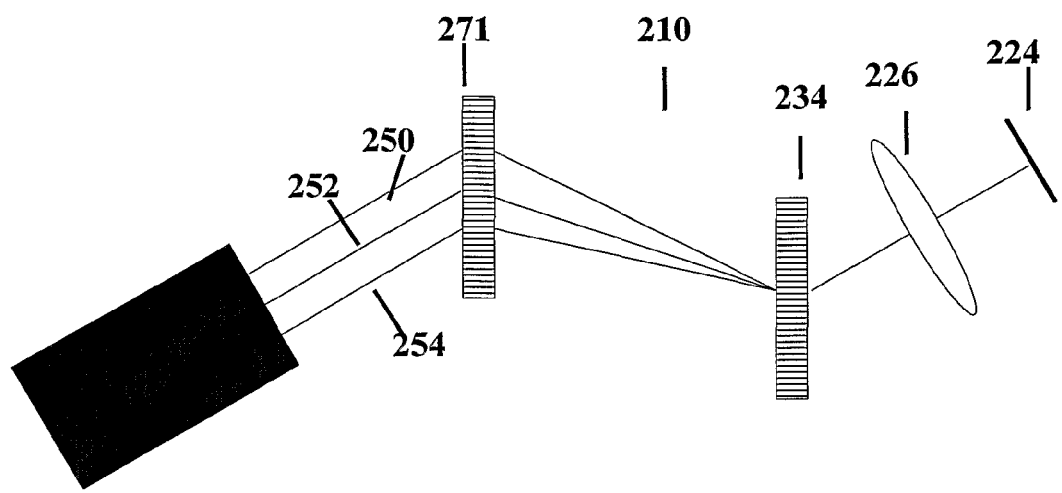
FIGS. 7A and 7B illustrate two embodiments of a laser system according to the invention utilizing respectively two different mechanisms for controlling the dispersion of the optical cavity.
Figure 7B:
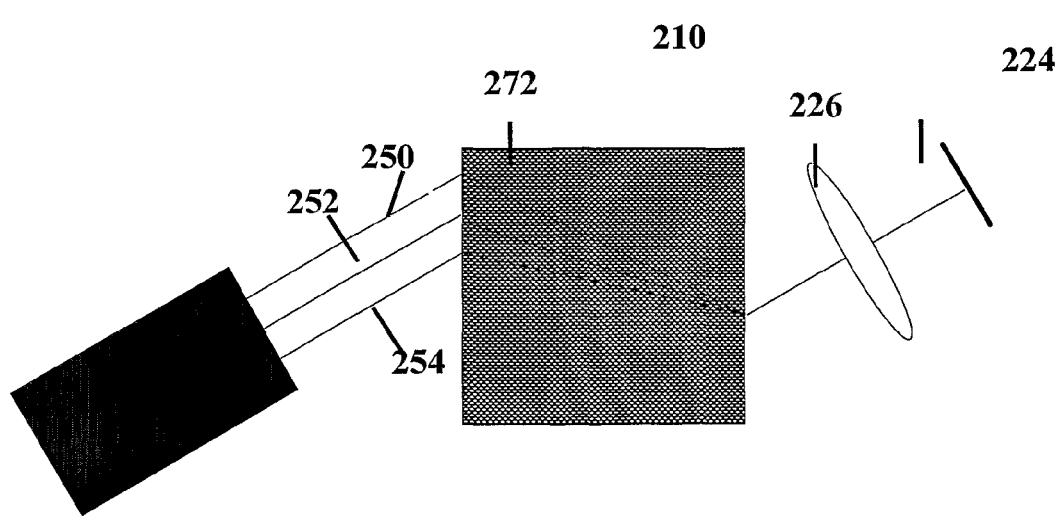

FIGS. 7A and 7B illustrate schematically two embodiments of a laser system (resonator cavities) according to the present invention utilizing respectively two different configurations of an optical manipulator. More specifically, in these examples, the different optical manipulators utilize different mechanisms for controlling the dispersion of the optical cavity implemented by spectral beam splitter/combiners (e.g. gratings, photonic crystals) and appropriate arrangement of the optical elements of the cavity. To facilitate understanding, elements common with other embodiments of the invention described above are marked with the same reference numerals.

In the example of FIG. 7A, the optical length of the different optical longitudinal modes of the cavity is adjusted by utilizing multiple (two in the present example) gratings that are spatially located and oriented within the cavity to provide a desired variation to the optical lengths of the optical paths corresponding different optical modes of the cavity. Moreover, in some embodiments of the invention, tunable dispersion of the cavity (e.g. during the operation of the laser) is achieved by enabling different positioning of at least one of the gratings to achieve different optical lengths of the optical modes within the cavity or to achieve a variation in the allowable longitudinal modes of the cavity.

In the example of FIG. 7B, the optical length of the different optical longitudinal modes of the cavity is adjusted by utilizing a dispersive element such as a prism or superprism. The dispersive element is spatially located and oriented within the cavity to provide splitting and combining of the optical beam and a desired variation to the optical lengths of the optical paths corresponding different optical modes of the cavity, as well as splitting and combining of them.

In these embodiments of the invention, only a single gain medium 230 is illustrated in which the optical paths of different longitudinal modes (250, 252, 254) of the laser are shown to propagate in separate spaced-apart relationship. It should however be understood that various modification of this element 230 can be made, for example by utilizing an array of gain media associated with different longitudinal modes as illustrated in FIG. 2 above or in another example, spatially combining (e.g. by an additional spectral beam splitter/combiner) the different longitudinal modes prior to their entrance to the gain media such that they propagate in an overlapping manner within the gain 130.

The invention claimed is:

1. A laser resonator cavity comprising:
   a first section;
   a second section;
   a dispersive optical element between the first section and the second section for frequency dispersing light beams at different optical lengths along spatially separated optical paths, to define different longitudinal modes, in the second section; and
   an optical manipulator for creating optical length changes along each optical path which is proportional to the optical frequency change of the light beam that travels along said each optical path.

2. The laser resonator cavity of claim 1, wherein said optical manipulator is configured for adjusting at least one of spatial shape, temporal shape and repetition rate of an output pulse.

3. The laser resonator cavity of claim 1, wherein the dispersive optical element includes a spectral beam splitter, configured for separating a combined light beam into the different longitudinal modes for propagating along the different spatially separated optical paths.

4. The laser resonator cavity of claim 3, comprising a mode locking assembly in the first section positioned to accommodate the combined light beam.

5. The laser resonator cavity of claim 2, wherein said optical manipulator comprises an intensity control assembly.

6. The laser resonator cavity of claim 1, wherein said optical manipulator comprises an intensity control assembly, thus enabling control of both amplitude and frequency of the different longitudinal modes.

7. The laser resonator cavity of claim 6, wherein the intensity control assembly comprises a plurality of intensity control units arranged across the different optical paths of the different longitudinal modes, the intensity control units being configured to adjust relative intensities of each of the different longitudinal modes propagating in the different paths, separately.

8. The laser resonator cavity of claim 1, wherein the second section includes a dispersion control assembly comprising rising different dispersion control media for positioning in the paths of the different longitudinal modes thereby independently adjusting the optical lengths of each of the different modes.

9. The laser resonator cavity of claim 1, comprising one or more gain media in the second section, the gain media comprising:
   an array of optical gain sources arranged for accommodating the different optical paths of the different longitudinal modes propagating within the cavity for separately amplifying the different longitudinal modes.

10. The laser resonator cavity of claim 4, wherein said mode locking assembly comprises a saturatable absorber.

11. The laser resonator cavity of claim 1, wherein the optical manipulator includes a dispersion control assembly configured to increase the length of the optical path with an increase of the frequency of the longitudinal mode.

12. The laser resonator cavity of claim 1, wherein the optical manipulator includes a dispersion control assembly configured to decrease the length of the optical path with an increase of the frequency of the longitudinal mode.

13. The laser resonator cavity of claim 1, wherein the optical manipulator includes a dispersion control assembly configured to adjust the differences in the optical lengths such that frequencies ($f_k=f_0+k\delta$) of the different longitudinal modes are spaced by a constant equal amount $\delta$.

14. The laser resonator cavity of claim 8, wherein said dispersion control assembly comprises a multitude of dispersion control units which are arranged across the different optical paths of the different longitudinal modes propagating within the cavity, and the dispersion control units are configured to adjust the optical length of each of said different paths separately.

15. The laser resonator cavity of claim 14, wherein the dispersion control units have controllable optical lengths.

16. The laser resonator cavity of claim 14, wherein the dispersion control units are made of one or more materials having refraction index or indices varying in response to application of an external electric field.

17. The laser resonator cavity of claim 9, wherein said one or more gain media has one of the following configurations: (a) comprises an array of semiconductor edge emitting laser sources; (b) comprises a broad area semiconductor edge emitting laser source; (c) comprises an array of semiconductor vertically emitting laser sources; (d) comprises spaced apart laser gain medium regions having different lasing properties.

* * * * *